United States Patent
Lee et al.

(10) Patent No.: US 10,127,853 B2
(45) Date of Patent: Nov. 13, 2018

(54) METHOD OF COMPENSATING FOR AN EXCIMER LASER ANNEALING MURA AND DISPLAY DEVICE EMPLOYING THE SAME

(71) Applicant: SAMSUNG DISPLAY CO., LTD., Yongin-si, Gyeonggi-Do (KR)

(72) Inventors: Min-Tak Lee, Hwaseong-si (KR); Kyu-Seok Kim, Asan-si (KR); Soo-Young Kim, Seoul (KR); Young-Nam Yun, Suwon-si (KR); Hyun-Koo Lee, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 6 days.

(21) Appl. No.: 15/388,933

(22) Filed: Dec. 22, 2016

(65) Prior Publication Data

US 2017/0206821 A1    Jul. 20, 2017

(30) Foreign Application Priority Data

Jan. 20, 2016   (KR) .................. 10-2016-0006909

(51) Int. Cl.
*G09G 3/20* (2006.01)
*G09G 3/32* (2016.01)
(Continued)

(52) U.S. Cl.
CPC ......... *G09G 3/2011* (2013.01); *G09G 3/3225* (2013.01); *G09G 3/3266* (2013.01);
(Continued)

(58) Field of Classification Search
CPC .. G09G 3/2011; G09G 3/3225; G09G 3/3266; G09G 3/3275; G09G 3/3677;
(Continued)

(56) References Cited

U.S. PATENT DOCUMENTS

| | | | |
|---|---|---|---|
| 2007/0126975 A1* | 6/2007 | Choi | G02F 1/1309 349/192 |
| 2007/0251926 A1* | 11/2007 | Turk | B23K 26/0738 219/121.61 |
| 2014/0225943 A1* | 8/2014 | Shiobara | G09G 3/3413 345/694 |

FOREIGN PATENT DOCUMENTS

KR   10-2006-0055016   5/2006

* cited by examiner

*Primary Examiner* — Stephen G Sherman
(74) *Attorney, Agent, or Firm* — F. Chau & Associates, LLC

(57) ABSTRACT

A method of compensating for Mura in a display panel includes displaying a high gray-scale image and a low gray-scale image on a display panel. The displayed images are photographed to generate a high gray-scale luminance image and a low gray-scale luminance image. An ELA Mura for-measurement image having moiré-removed luminance values is generated by dividing luminance values of the low gray-scale luminance image by luminance values of the high gray-scale luminance image. One-dimensional average data is obtained from the ELA Mura for-measurement image. The one-dimensional average data is transformed into frequency-domain data. Target frequency-domain data having a maximum peak value is identified from the frequency-domain data. A direction, an intensity, and a frequency of the ELA Mura are obtained from the target frequency-domain data. A filter is determined based on the obtained information. The filter is applied to image data.

20 Claims, 14 Drawing Sheets

(51) Int. Cl.
  *G09G 3/3225* (2016.01)
  *G09G 3/3266* (2016.01)
  *G09G 3/3275* (2016.01)
  *G09G 3/36* (2006.01)
  *H01L 21/02* (2006.01)
  *H01L 27/12* (2006.01)

(52) U.S. Cl.
  CPC ......... *G09G 3/3275* (2013.01); *G09G 3/3677* (2013.01); *G09G 3/3688* (2013.01); *G09G 2310/08* (2013.01); *G09G 2320/0646* (2013.01); *G09G 2340/0492* (2013.01); *G09G 2360/145* (2013.01); *G09G 2360/16* (2013.01); *H01L 21/02678* (2013.01); *H01L 21/02686* (2013.01); *H01L 27/1274* (2013.01)

(58) Field of Classification Search
  CPC ............. G09G 3/3688; G09G 2310/08; G09G 2320/0646; G09G 2340/0492; G09G 2360/145; G09G 2360/16; G09G 2320/0233; G09G 2320/0242; H01L 21/02678; H01L 21/02686; H01L 21/1274
  See application file for complete search history.

METHOD OF COMPENSATING FOR AN EXCIMER LASER ANNEALING MURA AND DISPLAY DEVICE EMPLOYING THE SAME

CROSS-REFERENCE TO RELATED APPLICATION(S)

This application claims priority under 35 USC § 119 to Korean Patent Application No. 10-2016-0006909, filed on Jan. 20, 2016 in the Korean Intellectual Property Office (KIPO), the contents of which are incorporated by reference herein in its entirety.

TECHNICAL FIELD

Exemplary embodiments of the present inventive concept relate generally to a display device. More particularly, exemplary embodiments of the present inventive concept relate to a method of compensating for an excimer laser annealing (ELA) Mura that exists in a display panel and a display device employing the method of compensating for the ELA Mura.

DISCUSSION OF THE RELATED ART

Generally, a display device displays an image by controlling the way light is emitted therethrough. For example, a display device may display an image by controlling a degree of light emission within each of a plurality of pixels by turning on or off thin film transistors included in each of the pixels. The thin film transistor includes a semiconductor layer, a gate electrode, a source electrode, and a drain electrode. Here, polysilicon generated by crystallizing amorphous silicon is widely used as the semiconductor layer. Thus, when the display panel is manufactured, a process of crystallizing the amorphous silicon formed on a substrate to the polysilicon is performed. The process of crystallizing the amorphous silicon to the polysilicon may be performed using an excimer laser in a process known as excimer laser annealing (ELA). However, since the excimer laser beam used in the ELA process has a pulse shape, stripe stains having a fine interval (e.g., an interval corresponding to 3 to 5 pixels) are formed on the substrate. This creates within the displayed image a kind of moiré pattern that is referred to as an ELA Mura. The ELA Mura may be recognized when a low gray-scale image is displayed on the display panel or when a viewer watches the display panel through lenses having a specific magnification like a head mounted display (HMD) device that may be used as part of a virtual reality (VR) headset. Since a direction and an intensity of the ELA Mura cannot be accurately measured by an interference phenomenon between a cycle of the ELA and a cycle of the pixels, a conventional ELA Mura compensating method cannot accurately compensate for the ELA Mura that exists in the display panel.

SUMMARY

A method of compensating for Mura in a display panel includes displaying a high gray-scale image and a low gray-scale image on a display panel. The high gray-scale image and the low gray-scale image are photographed using a luminance measuring equipment to generate a high gray-scale luminance image and a low gray-scale luminance image, respectively. An ELA Mura for-measurement image having moiré-removed luminance values is generated by dividing luminance values of the low gray-scale luminance image by luminance values of the high gray-scale luminance image. One-dimensional average data is obtained, at predetermined rotation angles while rotating the ELA Mura for-measurement image, by sequentially listing average luminance values, each of which is calculated by averaging luminance values in a predetermined direction on the ELA Mura for-measurement image. The obtained one-dimensional average data is transformed into frequency-domain data using a Fast Fourier Transform algorithm. Target frequency-domain data having a maximum peak value is identified from among the frequency-domain data. A direction, an intensity, and a frequency of the ELA Mura are obtained from the target frequency-domain data. An ELA Mura for-compensation band-reject filter is determined based on the obtained direction, intensity, and frequency of the ELA Mura. The ELA Mura for-compensation band-reject filter is applied to initial image data to generate corrected image data.

A display device includes a display panel including a plurality of pixels. A scan driver is configured to provide a scan signal to the display panel. A data driver is configured to provide a data signal to the display panel. A timing controller is configured to control the scan driver and the data driver. An excimer laser annealing (ELA) Mura compensator is configured to generate ELA Mura compensated image data corresponding to the data signal by applying an ELA Mura for-compensation band-reject filter to image data.

A method for displaying an image includes manufacturing a display panel having a plurality of pixels, each of the plurality of pixels having a thin film transistor with a semiconductor layer disposed between a source and a drain electrode. The semiconductor layer is formed by crystallizing amorphous silicon by excimer laser annealing. A fully dark image is displayed on the manufactured display panel. The displayed fully dark image is photographed to provide a dark-image luminance image. A fully light image is displayed on the manufactured display panel. The displayed fully light image is photographed to provide a light-image luminance image. A Mura compensation filter is calculated based on both the dark-image luminance image and the light-image luminance image. The manufactured display panel is programmed to apply the calculated Mura compensation filter to image data when displaying an image.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Hereinafter, the present invention will be explained in detail with reference to the accompanying drawings.

Figure 1:
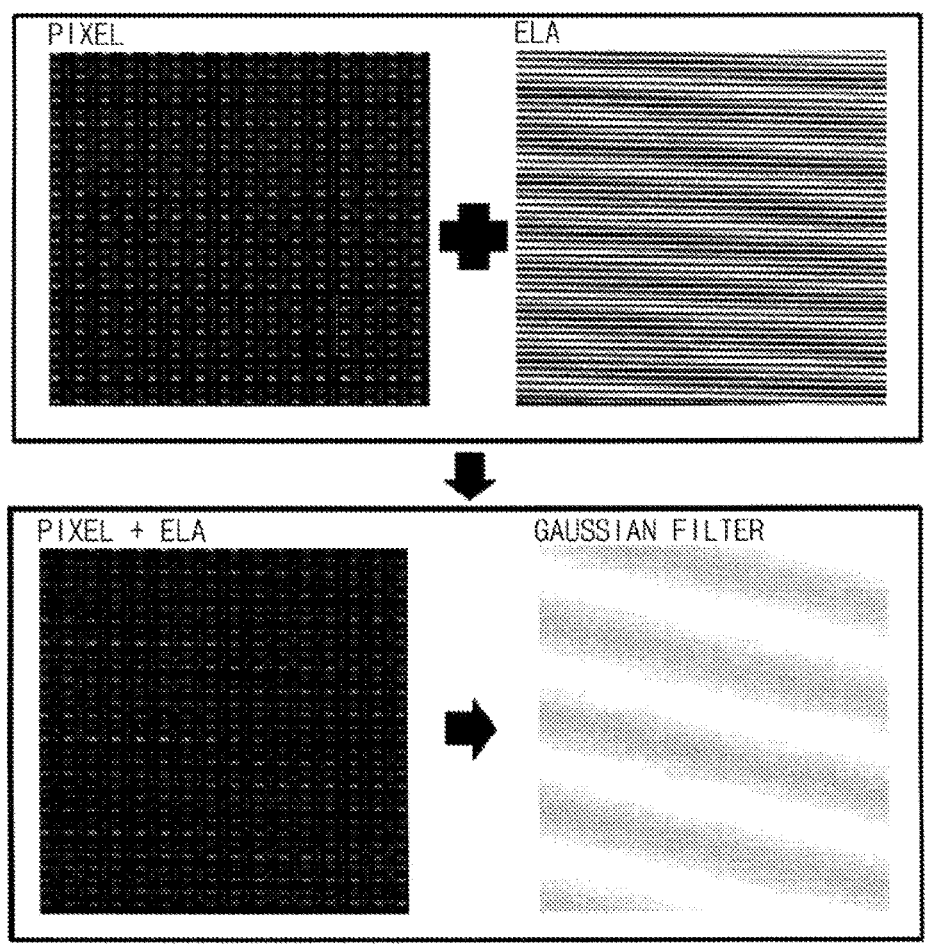
FIG. 1 is a diagram illustrating an interference phenomenon between a cycle of an ELA Mura and a cycle of pixels caused in a display device.
Figure 2:
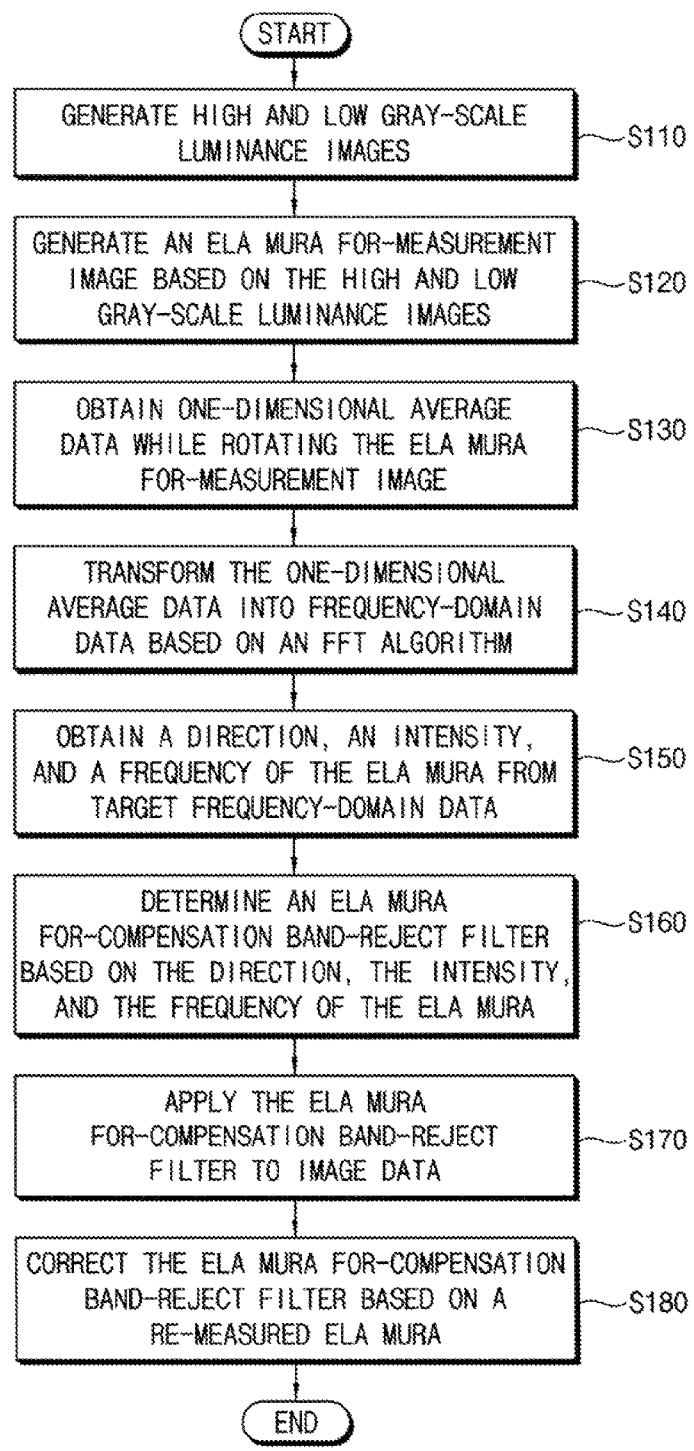
FIG. 2 is a flowchart illustrating a method of compensating for an ELA Mura according to exemplary embodiments of the present inventive concept.

FIG. 1 is a diagram illustrating an interference phenomenon between a cycle of an ELA Mura and a cycle of pixels caused in a display device. FIG. 2 is a flowchart illustrating a method of compensating for an ELA Mura according to exemplary embodiments of the present inventive concept.

Referring to FIGS. 1 and 2, the method of FIG. 2 may generate a high gray-scale luminance image and a low gray-scale luminance image by photographing a high gray-scale image and a low gray-scale image that are displayed on a display panel using a luminance measuring equipment (S110). The high gray-scale luminance image may be an image displayed on a display panel that is particularly light while the low gray-scale luminance image may be an image displayed on the display panel that is particularly dark, however, the reverse might also be true. The photographs are then taken of the display panel as it displays the given image. An ELA Mura for-measurement image having moiré-removed luminance values may be generated by dividing luminance values of the low gray-scale luminance image by luminance values of the high gray-scale luminance image (S120). At predetermined rotation angles while rotating the ELA Mura for-measurement image, one-dimensional average data may be generated by sequentially listing average luminance values each of which is calculated by averaging luminance values in a predetermined direction on the ELA Mura for-measurement image (S130). The one-dimensional average data may be transformed into frequency-domain data based on a Fast Fourier Transform algorithm (S140). A direction, an intensity, and a frequency of the ELA Mura that exists in the display panel from target frequency-domain data having a maximum peak value among the frequency-domain data (S150) may be obtained. An ELA Mura for-compensation band-reject filter may be determined based on the direction, the intensity, and the frequency of the ELA Mura (S160). The ELA Mura for-compensation band-reject filter may be applied to image data to be displayed on the display panel (S170). In some exemplary embodiments of the present inventive concept, the method of FIG. 2 may correct the ELA Mura for-compensation band-reject filter based on a re-measured ELA. Mura that is generated by measuring the ELA Mura based on a for-correction image displayed on the display panel (S180).

Generally, when the display panel is manufactured, a process of crystallizing amorphous silicon to polysilicon is performed by an excimer laser annealing (ELA) process. However, since a laser beam radiated on the substrate in the ELA process has a pulse shape, as illustrated in FIG. 1, stripe stains having a fine interval (e.g., ELA Mura) are formed on the substrate. Here, since the ELA Mura is added to an image displayed on the display panel, the ELA Mura may result in degradation of image quality. Thus, in order to provide a high-quality image to a viewer, the ELA Mura that exists in the display panel may be compensated for. However, it may be difficult to accurately measure a direction and an intensity of the ELA. Mura because an interference phenomenon (e.g., indicated by PIXEL+ELA) between a cycle of the ELA Mura (e.g., indicated by ELA) and a cycle of the pixels (e.g., indicated by PIXEL) occurs. For example, when observing the interference phenomenon (e.g., indicated by PIXEL+ELA) with a Gaussian filter, it can be recognized that an observed stain (e.g., indicated by GAUSSIAN FILTER) is not consistent with the ELA Mura. Since some ELA Mura compensating methods cannot accurately compensate for the ELA Mura that exists in the display panel, these ELA Mura compensating method might not provide a high-quality image (e.g., an ELA Mura removed image) to the viewer. Accordingly, the method of FIG. 2 may generate the high gray-scale luminance image and the low gray-scale luminance image by photographing the high gray-scale image and the low gray-scale image that are displayed on the display panel using the luminance measuring equipment (S110). The ELA Mura for-measurement image having the moiré-removed luminance values that are generated by dividing the luminance values of the low gray-scale luminance image by the luminance values of the high gray-scale luminance image (S120) may be generated. At the predetermined rotation angles while rotating the ELA Mura for-measurement image, the one-dimensional average data that are generated by sequentially listing the average luminance values, each of which is calculated by averaging the luminance values in the predetermined direction on the ELA Mura for-measurement image (S130), may be obtained. The one-dimensional average data may be transformed into the frequency-domain data based on the Fast Fourier Transform algorithm (S140). The direction, the intensity, and the frequency of the ELA Mura that exists in the display panel from the target frequency-domain data having the maximum peak value among the frequency-domain data (S150) may be obtained. The ELA Mura for-compensation band-reject filter based on the direction, the intensity, and the frequency of the ELA Mura (S160) may be determined. The ELA Mura for-compensation band-reject filter may be applied to the image data to be displayed on the display panel (S170). The ELA Mura for-compensation band-reject filter may be corrected based on the re-measured ELA Mura that is generated by measuring the ELA Mura based on the for-correction image displayed on the display panel (S180). As a result, the method of FIG. 2 may accurately compensate for the ELA Mura that exists in the display panel by accurately measuring the direction and the intensity of the ELA Mura that exists in the display panel. Hereinafter, the steps S110, S120, S130, S140, S150, S160, S170, and S180 will be described in detail with reference to FIGS. 3 through 11.

Figure 3:
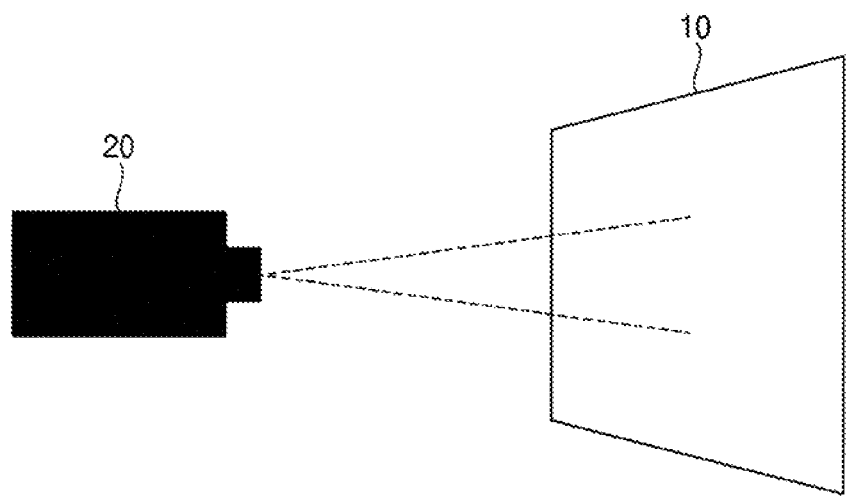
FIG. 3 is a diagram illustrating a low gray-scale image and a high gray-scale image that are displayed on a display panel, photographed by the method of FIG. 2 according to exemplary embodiments of the present inventive concept.

FIG. 3 is a diagram illustrating a low gray-scale image and a high gray-scale image that are displayed on a display panel and are photographed by the method of FIG. 2.

Referring to FIG. 3, the method of FIG. 2 may generate the high gray-scale luminance image HLI and the low gray-scale luminance image LLI by photographing the high gray-scale image and the low gray-scale image that are displayed on the display panel 10 using the luminance measuring equipment 20 (S110). For example, when the high gray-scale image corresponding to a high gray-scale pattern that is prepared in advance for ELA Mura compensation is displayed on the display panel 10, the method of FIG. 2 may generate the high gray-scale luminance image HLI by photographing the high gray-scale image using the luminance measuring equipment 20. In addition, when the low gray-scale image corresponding to a low gray-scale pattern that is prepared for the ELA Mura compensation is displayed on the display panel 10, the method of FIG. 2 may generate the low gray-scale luminance image LLI by photographing the low gray-scale image using the luminance measuring equipment 20. According to an exemplary embodiment of the present inventive concept, each of the high gray-scale image and the low gray-scale image may be photographed once. According to an exemplary embodiment of the present invention, each of the high gray-scale image and the low gray-scale image may be photographed several times. Here, the high gray-scale image may be an image having a gray-scale that is higher than a predetermined reference gray-scale, and the low gray-scale image may be an image having a gray-scale that is lower than the predetermined reference gray-scale. In some exemplary embodiments of the present inventive concept, each of the high gray-scale image and the low gray-scale image may be an image having a single gray-scale, for example, each image may include a single, uniform color. Generally, the ELA Mura that exists in the display panel 10 might only be readily recognized when a relatively low gray-scale image is displayed on the display panel 10. Thus, some ELA Mura compensating methods uses only the low gray-scale luminance image LLI to compensate for the ELA Mura that exists in the display panel 10. However, the method of FIG. 2 may remove compensate for) a moiré between a pixel arrangement of the display panel 10 and a pixel arrangement of the luminance measuring equipment 20 by using both the low gray-scale luminance image LLI and the high gray-scale luminance image HLI. As a result, the method of FIG. 2 may more accurately measure the direction and the intensity of the ELA Mura that exists in the display panel 10. This is because the method of FIG. 2 measures the direction and the intensity of the ELA Mura that exists in the display panel 10 using an ELA Mura for-measurement image MEI in which the moiré between the pixel arrangement of the display panel 10 and the pixel arrangement of the luminance measuring equipment 20 is removed.

Figure 4:
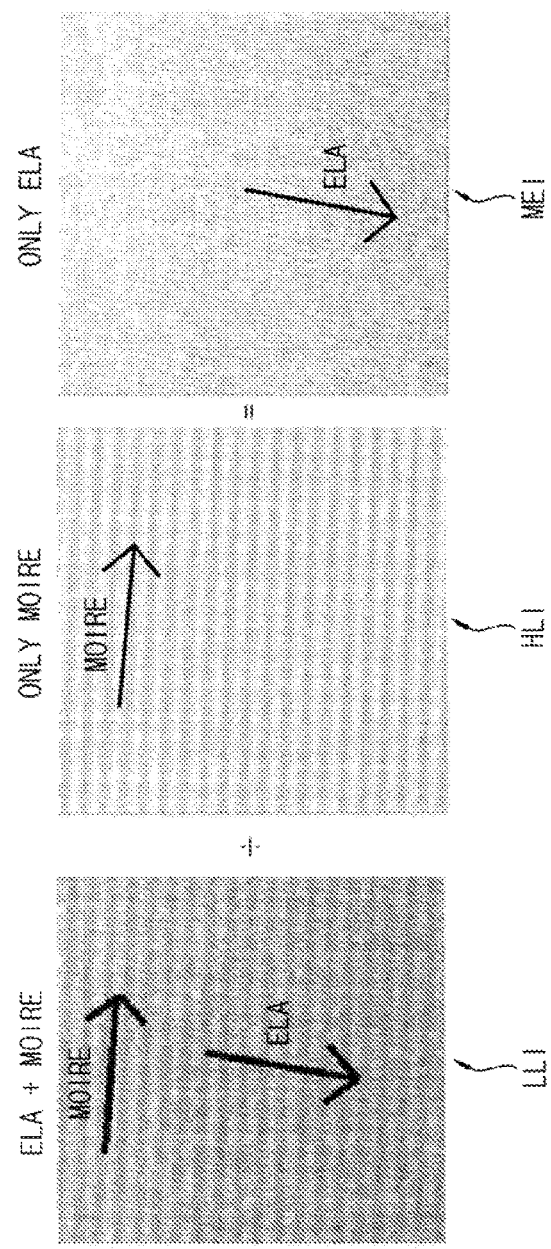
FIG. 4 is a diagram illustrating an ELA Mura for-measurement image in which a moiré between a pixel arrangement of a display panel and a pixel arrangement of a luminance measuring equipment is removed, generated by the method of FIG. 2 according to exemplary embodiments of the present inventive concept.

FIG. 4 is a diagram illustrating an ELA Mura for-measurement image in which a moiré between a pixel arrangement of a display panel and a pixel arrangement of a luminance measuring equipment is removed, generated by the method of FIG. 2, according to an exemplary embodiment of the present inventive concept.

Referring to FIG. 4, the method of FIG. 2 may generate the ELA Mura for-measurement image MEI having the moiré-removed luminance values by dividing the luminance values of the low gray-scale luminance image LLI by the luminance values of the high gray-scale luminance image (S120). When an image displayed on the display panel 10 is photographed by the luminance measurement equipment 20, the moiré (indicated by "MOIRE") between the pixel arrangement of the display panel 10 and the pixel arrangement of the luminance measurement equipment 20 may be generated. Thus, when the low gray-scale luminance image LLI is generated by photographing the low gray-scale image displayed on the display panel 10 using the luminance measuring equipment 20, the moiré between the pixel arrangement of the display panel 10 and the pixel arrangement of the luminance measurement equipment 20 may be added to the ELA Mura indicated by "ELA") in the low gray-scale luminance image LLI (i.e., indicated by ELA+MOIRE). For example, it may be difficult to recognize the ELA Mura in the low gray-scale luminance image LLI because of the moiré between the pixel arrangement of the display panel 10 and the pixel arrangement of the luminance measurement equipment 20. When the high gray-scale luminance image HLI is generated by photographing the high gray-scale image displayed on the display panel 10 using the luminance measuring equipment 20, only the moiré between the pixel arrangement of the display panel 10 and the pixel arrangement of the luminance measurement equipment 20 may exist in the high gray-scale luminance image HLI (indicated by "ONLY MOIRE"). For example, since the ELA Mura may be recognized only when the low gray-scale image is displayed on the display panel 10, the ELA Mura might not exist in the high gray-scale luminance image HLI. For this reason, when the low gray-scale luminance image LLI is divided by the high gray-scale luminance HLI at respective positions of the display panel 10, the moiré between the pixel arrangement of the display panel 10 and the pixel arrangement of the luminance measurement equipment 20 may be removed (indicated by "ONLY ELA"). For example, the ELA Mura for-measurement image MEI may have the moiré-removed luminance values that are generated by dividing the luminance values of the low gray-scale luminance image LLI by the luminance values of the high gray-scale luminance image HLI. In some exemplary embodiments of the present inventive concept, for convenience of future calculation, the moiré-removed luminance values may be normalized to be less than or equal to 1.

Figure 5:
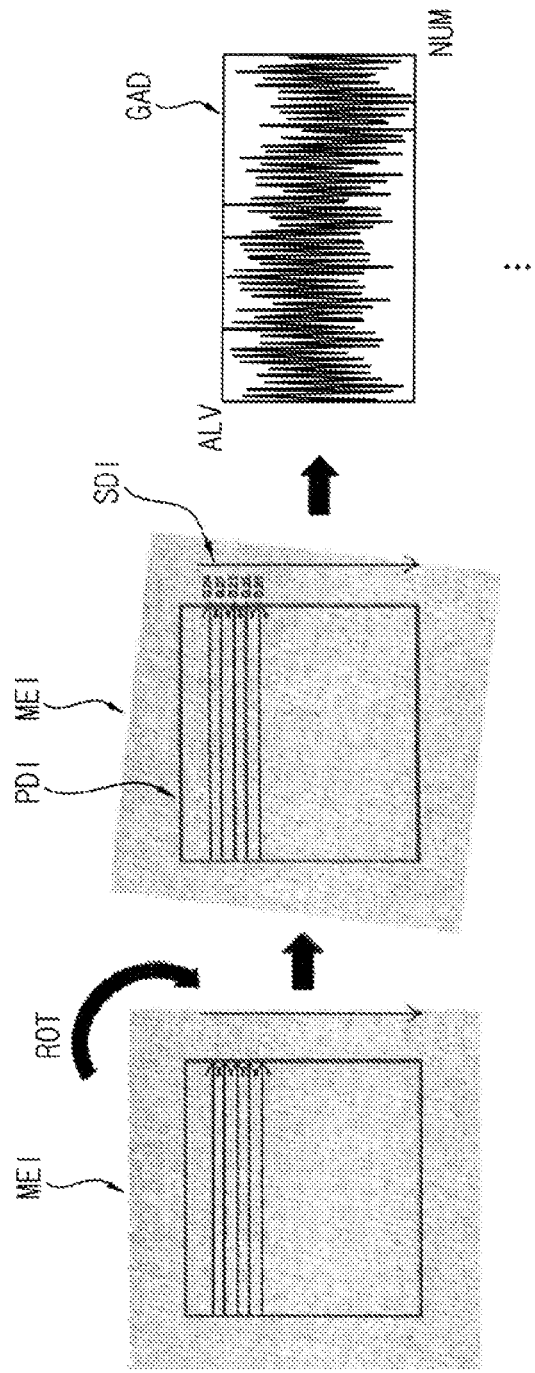
FIG. 5 is a diagram illustrating one-dimensional average data of an ELA Mura for-measurement image obtained while the ELA Mura for-measurement image is rotated by the method of FIG. 2 according to exemplary embodiments of the present inventive concept.

FIG. 5 is a diagram illustrating one-dimensional average data of an ELA Mura for-measurement image obtained while the ELA Mura for-measurement image is rotated by the method of FIG. 2, according to exemplary embodiments of the present inventive concept.

Referring to FIG. 5, the method of FIG. 2 may obtain, at the predetermined rotation angles while rotating the ELA Mura for-measurement image MEI (indicated by "ROT"), the one-dimensional average data GAD that are generated by sequentially listing the average luminance values (indicated by "SDI") each of which is calculated by averaging the luminance values in the predetermined direction (indicated by "PDI") on the ELA Mura for-measurement image MEI (S130). For example, as illustrated in FIG. 5, the one-dimensional average data GAD may be data that sequentially lists 0.15, 0.21, 0.22, 0.26, 0.21, . . . because each of the average luminance values, calculated by averaging the luminance values in the predetermined direction on the ELA Mura for-measurement image MEI, are 0.15, 0, 21, 0.22, 0.26, 0.21, . . . in the order listed. Thus, the one-dimensional average data. GAD, may be represented by an X-axis (indicated by "NUM") and a Y-axis (indicated by "ALV"). Here, the X-axis indicates a direction in which the average luminance values are sequentially listed, and the Y-axis indicates the average luminance values each of which is calculated by averaging the luminance values in the predetermined direction on the ELA Mura for-measurement image MEI. According to an exemplary embodiment of the present inventive concept, the method of FIG. 2 may rotate the ELA Mura for-measurement image MEI from 0° to 180° and may set an interval of the predetermined rotation angles to be 0.1°. In this case, the number of the one-dimensional average data GAD may be 1800 (i.e., 180÷0.1=1800). For example, since the one-dimensional average data GAD is obtained at each of the predetermined rotation angles, 1800 one-dimensional average data GAD may be obtained when the ELA Mura for-measurement image MEI is rotated from 0° to 180°, and the interval of the predetermined rotation angles is 0.1°. For the ELA Mura compensation, a rotation angle range (e.g., the predetermined rotation angles) for the ELA Mura for-measurement image MEI and the interval of the predetermined rotation angles may be variously determined.

Figure 6:
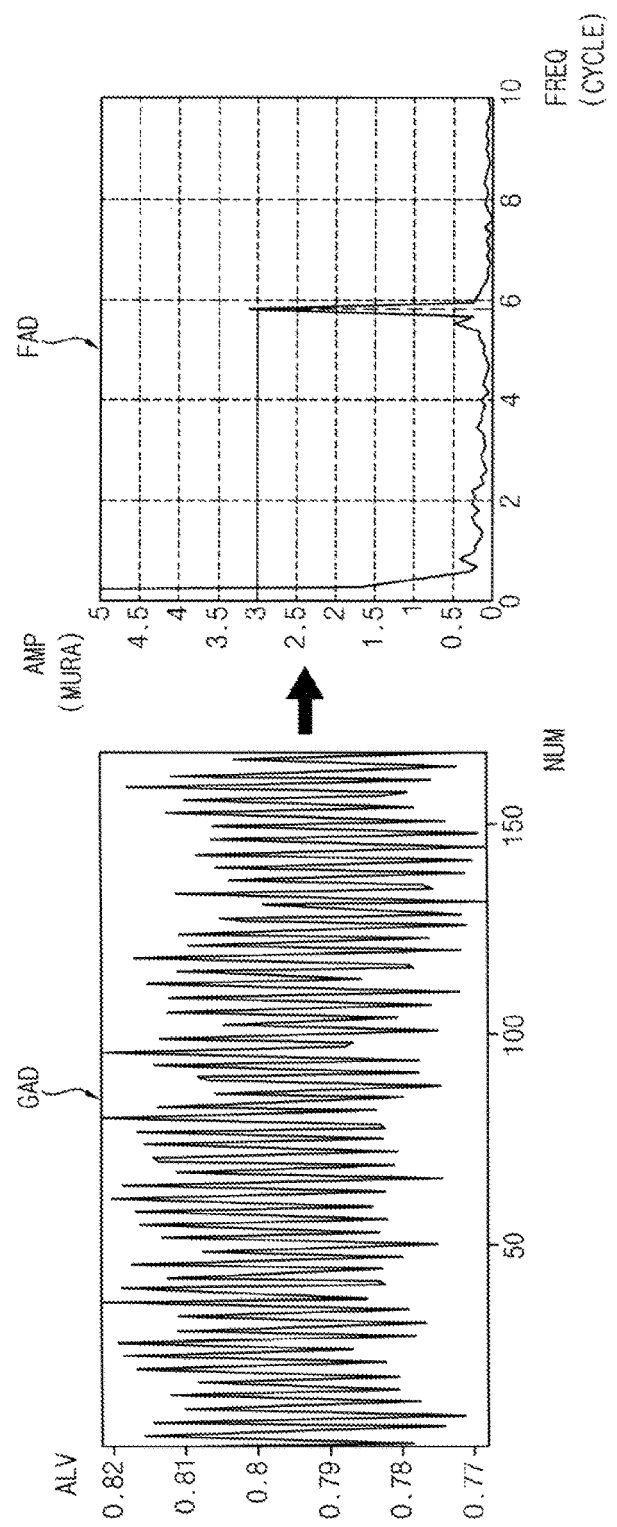
FIG. 6 is a diagram illustrating one-dimensional average data of an ELA Mura for-measurement image transformed into frequency-domain data based on a Fast Fourier Transform algorithm by the method of FIG. 2 according to exemplary embodiments of the present inventive concept.
Figure 7:
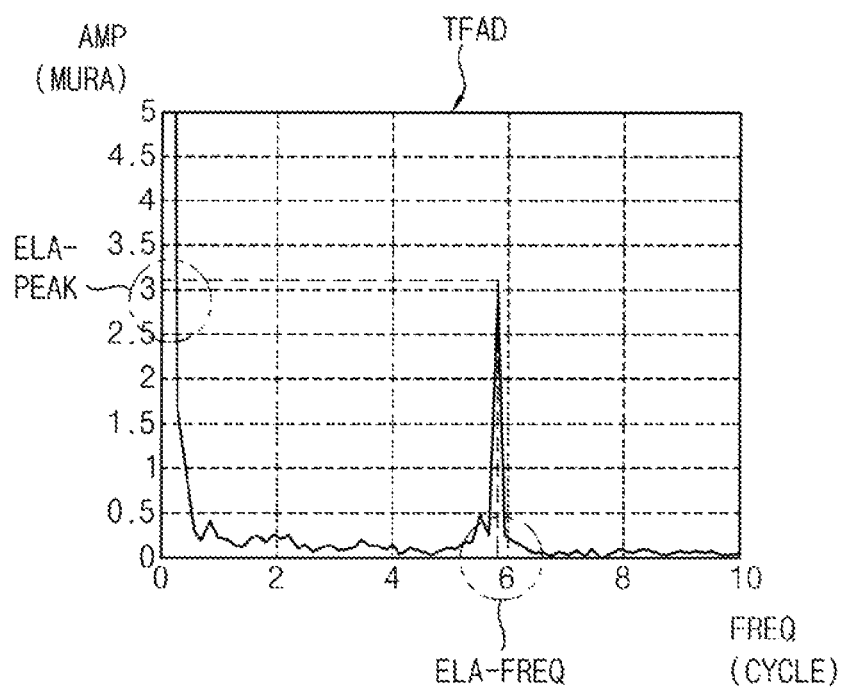
FIG. 7 is a diagram illustrating a direction, an intensity, and a frequency of an ELA Mura that exists in a display panel, determined by the method of FIG. 2 according to exemplary embodiments of the present inventive concept.

FIG. 6 is a diagram illustrating one-dimensional average data of an ELA Mura for-measurement image, transformed into frequency-domain data using a Fast Fourier Transform algorithm by the method of FIG. 2. FIG. 7 is a diagram illustrating a direction, an intensity and a frequency of an ELA Mura that exists in a display panel, determined by the method of FIG. 2.

Referring to FIGS. 6 and 7, the method of FIG. 2 may transform the one-dimensional average data GAD into the frequency-domain data FAD using the Fast Fourier Transform algorithm (S140) and may obtain the direction, the intensity, and the frequency of the ELA Mura that exists in the display panel from the target frequency-domain data TFAD having the maximum peak value (indicated by "ELA-PEAK") among the frequency-domain data FAD (S150). Specifically, as illustrated in FIG. 6, the method of FIG. 2 may transform the one-dimensional average data GAD into the frequency-domain data. FAD represented in a frequency-domain. Thus, the frequency-domain data FAD may be represented by an X-axis (indicated by "FREQ(CYCLE)") indicating a frequency (e.g. a cycle) and a Y-axis (indicated by "AMP(MURA)") indicating an amplitude (e.g. an intensity) of the ELA Mura. Here, when the ELA Mura for-measurement image MEI is rotated from 0° to 180°, and the interval of the predetermined rotation angles is 0.1°, the number of the frequency-domain data FAD may be 1800 because the number of the one-dimensional average data GAD is 1800. Thus, the method of FIG. 2 may select one frequency-domain data FAD having the maximum peak value among the frequency-domain data FAD as the target frequency-domain data TFAD and may obtain the direction, the intensity, and the frequency of the ELA Mura that exists in the display panel from the target frequency-domain data TFAD. According to an exemplary embodiment of the present inventive concept, as illustrated in FIG. 7, the direction of the ELA. Mura may be determined based on a rotation angle at which the target frequency-domain data TFAD is obtained, the intensity of the ELA Mura may be determined based on the maximum peak value of the target frequency-domain data TFAD, and the frequency of the ELA Mura may be determined based on a frequency indicated by "ELA-FREQ") at which the maximum peak value of the target frequency-domain data TFAD is located. For example, since the target frequency-domain data TFAD is the frequency-domain data FAD having the maximum peak value among the frequency-domain data FAD, the rotation angle at which the one-dimensional average data GAD corresponding to the target frequency-domain data TFAD is obtained may be determined as the direction of the ELA Mura, the maximum peak value (of the target frequency-domain data TFAD may be determined as the intensity of the ELA Mura, and the frequency at which the maximum peak value of the target frequency-domain data TFAD is located may be determined as the frequency of the ELA Mura.

Figure 8:
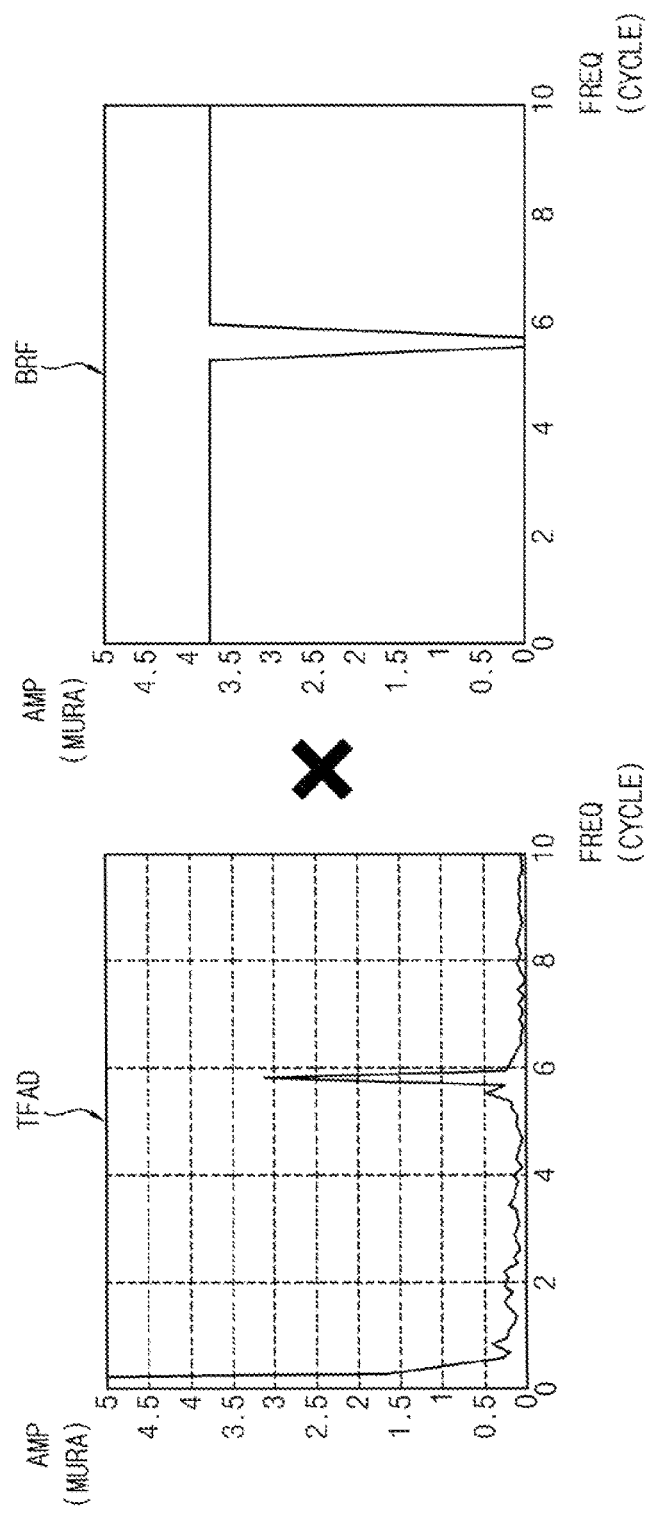
FIG. 8 is a diagram illustrating an ELA Mura for-compensation band-reject filter that compensates for an ELA Mura that exists in a display panel, determined by the method of FIG. 2 according to exemplary embodiments of the present inventive concept.
Figure 9:
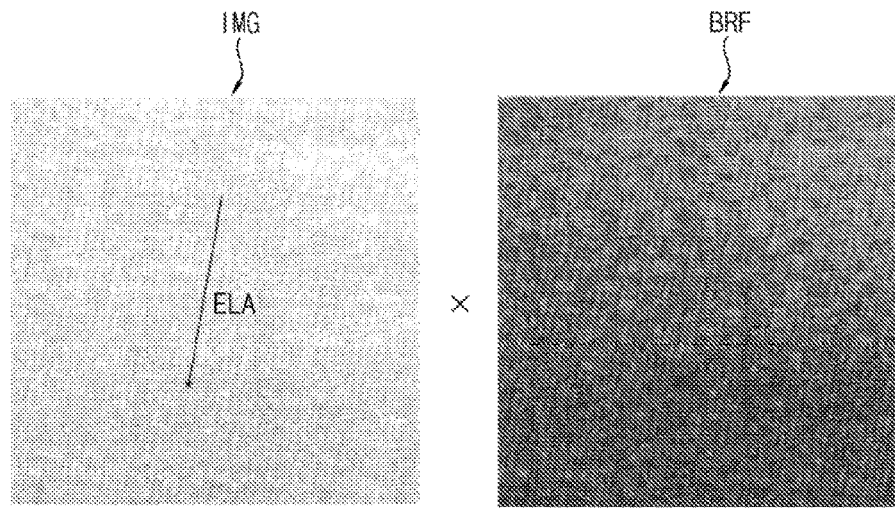
FIG. 9 is a diagram illustrating an ELA Mura for-compensation band-reject filter applied to image data to be displayed on a display panel by the method of FIG. 2 according to exemplary embodiments of the present inventive concept.

FIG. 8 is a diagram illustrating an ELA Mura for-compensation band-reject filter that compensates for an ELA Mura that exists in a display panel, determined by the method of FIG. 2. FIG. 9 is a diagram illustrating an ELA Mura for-compensation band-reject filler applied to image data to be displayed on a display panel by the method of FIG. 2.

Referring to FIGS. 8 and 9, the method of FIG. 2 may determine the ELA Mura for-compensation band-reject filter based on the direction, the intensity, and the frequency of the ELA Mura (S160) and may apply the ELA Mura for-compensation band-reject filter to the image data IMG to be displayed on the display panel 10 (S170). As illustrated in FIG. 8, the rotation angle at which the target frequency-domain data TFAD is obtained may be determined as the direction of the ELA Mura. The maximum peak value of the target frequency-domain data TFAD may be determined as the intensity of the ELA Mura. The frequency at which the maximum peak value of the target frequency-domain data TFAD is located may be determined as the frequency of the ELA Mura. Thus, the method of FIG. 2 may determine the ELA Mura for-compensation band-reject filter BRF to band-reject the frequency of the ELA Mura corresponding to the frequency at which the maximum peak value of the target frequency-domain data TFAD is located. For example, the band-reject frequency band of the ELA Mura for-compensation band-reject filter BRF may include the frequency at which the maximum peak value of the target frequency-domain data TFAD is located. Here, the band-reject frequency band of the ELA Mura for-compensation band-reject filter BRF may be widened or narrowed according to requirements for the ELA Mura compensation. As a result, as illustrated in FIG. 9, the ELA Mura that exists in the display panel 10 may be removed as the ELA Mura for-compensation band-reject filter BRF is applied to the image data IMG that is being displayed on the display panel 10. According to exemplary embodiments of the present inventive concept, the ELA Mura for-compensation band-reject filter BRF might not have the band-reject frequency band when the maximum peak value of the target frequency-domain data TFAD is less than a predetermined reference value. In this case, the ELA Mura might not be removed by the ELA Mura for-compensation band-reject filter BRF. For example, when the ELA Mura does not affect an image displayed on the display panel 10 as the ELA Mura is relatively weak, the ELA Mura for-compensation band-reject filter BRF might not be applied to the image data IMG.

Figure 10:
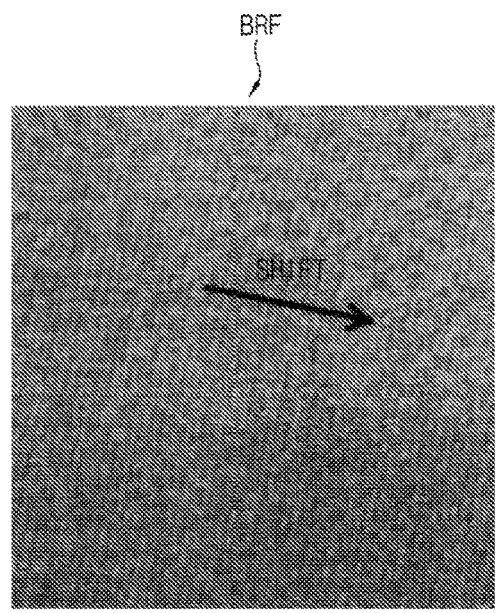
FIG. 10 is a diagram illustrating an ELA Mura for-compensation band-reject filter, corrected by the method of FIG. 2 according to exemplary embodiments of the present inventive concept.

FIG. 10 is a diagram illustrating an ELA Mura for-compensation band-reject filter corrected by the method of FIG. 2.

Referring to FIG. 10, the method of FIG. 2 may correct the ELA Mura for-compensation band-reject filter BRF based on the re-measured ELA Mura that is generated by measuring the ELA Mura based on the for-correction image displayed on the display panel 10 (S180). Although the ELA Mura for-compensation band-reject filter BRF may be determined by performing the steps S110, S120, S130, S140, S150, S160, and S170, an error may occur when the ELA Mura is measured. Thus, the method of FIG. 2 may display the for-correction image on the display panel 10, may measure the ELA Mura based on the for-correction image, and then may correct the ELA Mura for-compensation band-reject filter BRF if the ELA Mura is recognized. For example, the ELA Mura for-compensation band-reject filter BRF may be corrected by shifting an applying point of the ELA Mura for-compensation band-reject filter BRF by one pixel (indicated by "SHIFT"). However, a method of correcting the ELA Mura for-compensation band-reject filter BRF is not limited thereto. According to an exemplary embodiment of the present inventive concept, the for-correction image used in the step S180 may be the same as the low gray-scale image used in the step S110. According to an exemplary embodiment of the present inventive concept, the for-correction image used in the step S180 may be different from the low gray-scale image used in the step S110. In addition, the for-correction image used in the step S180 may be a color image or a black-and-white image. According to exemplary embodiments of the present inventive concept, the method of FIG. 2 may repeat the step S180 until the intensity of the re-measured ELA Mura is minimized.

Figure 11:
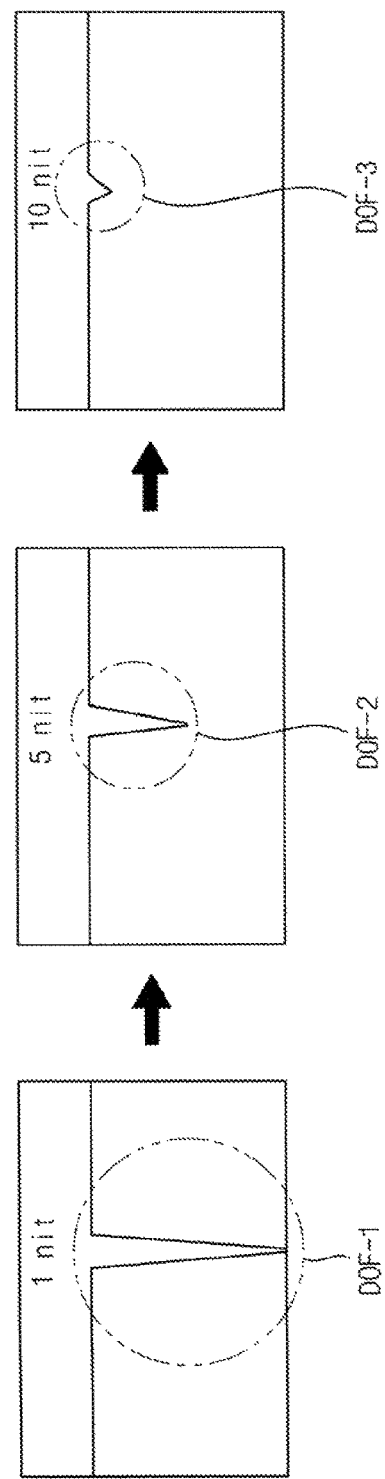
FIG. 11 is a diagram illustrating a degree of hand-reject filtering of an ELA Mura for-compensation band-reject filter that compensates for an ELA Mura that exists in a display panel, differentially determined according to luminance (e.g., gray-scale) of image data to be displayed on the display panel by the method of FIG. 2 according to exemplary embodiments of the present inventive concept.

FIG. 11 is a diagram illustrating a degree of band-reject filtering of an ELA Mura for-compensation band-reject filter that compensates for an ELA Mura that exists in a display panel, differentially determined according to luminance (e.g., gray-scale) of image data to be displayed on the display panel by the method of FIG. 2.

Referring to FIG. 11, the method of FIG. 2 may differentially determine the degree of the band-reject filtering of the ELA Mura for-compensation band-reject filter BRF according to the luminance of the image data to be displayed on the display panel 10. As described above, since the ELA Mura that exists in the display panel 10 is recognized primarily when the low gray-scale image is displayed on the display panel 10, the degree of the band-reject filtering of the ELA Mura for-compensation band-reject filter BRF might not have to be very high when the high gray-scale image is not displayed on the display panel 10. Thus, it may be unnecessary for the ELA Mura for-compensation band-reject filter BRF to perform the band-reject filtering on the high gray-scale image because the ELA Mura that exists in the display panel 10 is not recognized when the high gray-scale image is displayed on the display panel 10. Therefore, as illustrated in FIG. 11, the method of FIG. 2 may decrease the degree of the band-reject filtering of the ELA Mura for-compensation hand-reject filter BRF as the luminance of the image data increases (indicated by "DOF-1" "DOF-2," and "DOF-3"). For example, the ELA Mura for-compensation band-reject filter BRF to be applied to the image data for implementing the luminance of 1nit may have the first degree of the band-reject filtering, the ELA Mura for-compensation band-reject filter BRF to be applied to the image data for implementing the luminance of 5nit may have the second degree of the band-reject filtering that is lower than the first degree of the band-reject filtering, and the ELA Mura for-compensation band-reject filter BRF to be applied to the image data for implementing the luminance of 10nit may have the third degree of the band-reject filtering that is lower than the second degree of the band-reject filtering. According to an exemplary embodiment of the present inventive concept, the degree of the band-reject filtering of the ELA Mura for-compensation band-reject filter BRF may decrease linearly as the luminance of the image data increases. According to an exemplary embodiment of the present inventive concept, the degree of the band-reject filtering of the ELA Mura for-compensation band-reject filter BRF may decrease in a step shape as the luminance of the image data increases. In addition, the method of FIG. 2 may control the ELA Mura for-compensation band-reject filter BRF not to perform the band-reject filtering when the luminance of the image data is higher than predetermined reference luminance. Here, the reference luminance may be variously determined according to requirements for the ELA Mura compensation.

Figure 12:
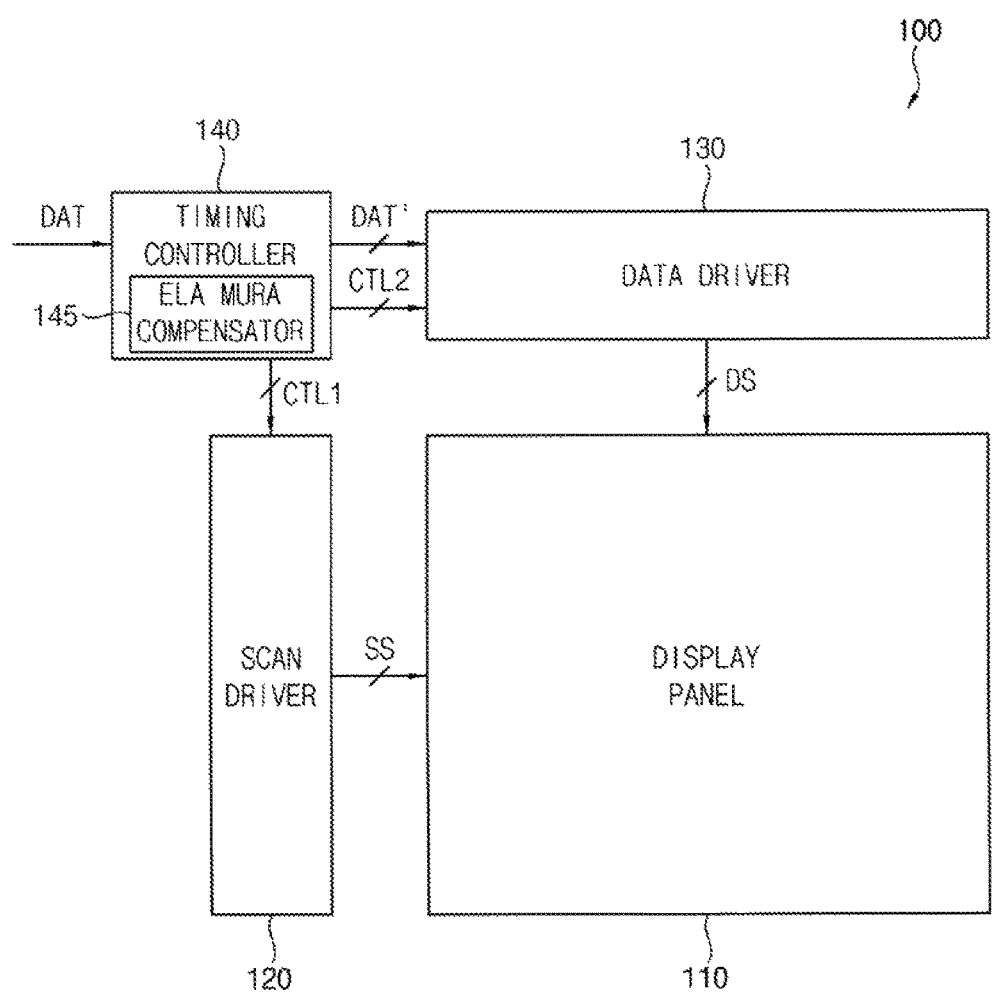
FIG. 12 is a block diagram illustrating a display device according to exemplary embodiments of the present inventive concept.
Figure 13:
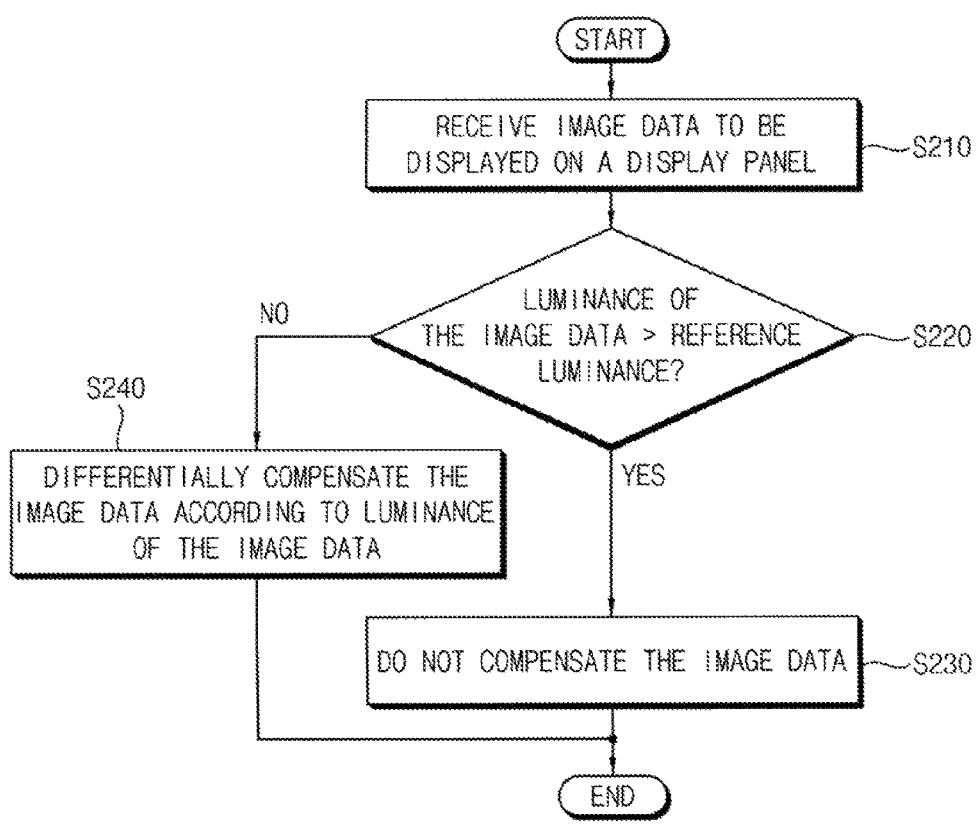
FIG. 13 is a flowchart illustrating the display device of FIG. 12 for determining whether to apply an ELA Mura for-compensation band-reject filter to image data according to luminance of the image data, according to exemplary embodiments of the present inventive concept.
Figure 14:
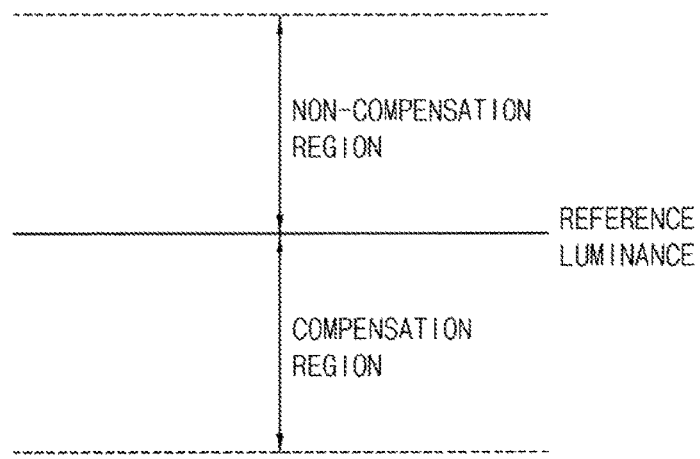
FIG. 14 is a diagram illustrating the display device of FIG. 12 for determining whether to apply an ELA Mura for-compensation band-reject filter to image data according to luminance of the image data according to exemplary embodiments of the present inventive concept.

FIG. 12 is a block diagram illustrating a display device according to exemplary embodiments of the present inventive concept. FIG. 13 is a flowchart illustrating the display device of FIG. 12 configured to determine whether to apply an ELA Mura for-compensation band-reject filter to image data according to luminance of the image data. FIG. 14 is a diagram illustrating the display device of FIG. 12 configured to determine whether to apply an ELA Mura for-compensation band-reject filter to image data according to luminance of the image data.

Referring to FIGS. 12 through 14, the display device 100 may include a display panel 110, a scan driver 120, a data driver 130, a timing controller 140, and an ELA Mura compensator 145. Here, the display device 100 may be an organic light emitting diode (OLED) display device or a liquid crystal display (LCD) device. However, the display device 100 is not limited to these particular types.

The display panel 110 may include a plurality of pixels. The display panel 110 may be connected to the scan driver 120 via scan-lines and may be connected to the data driver 130 via data-lines. The scan driver 120 may provide a scan signal SS to the display panel 110 via the scan-lines. The data driver 130 may provide a data signal DS to the display panel 110 via the data-lines. The timing controller 140 may generate control signals CTL1 and CTL2 and may provide the control signals CTL1 and CTL2 to the scan driver 120 and the data driver 130, respectively, to control the scan driver 120 and the data driver 130, respectively. According to exemplary embodiments of the present inventive concept, the timing controller 140 may receive image data DAT from an external component and may perform a specific processing (e.g., degradation compensation, etc) on the image data DAT. The ELA Mura compensator 145 may compensate for the ELA Mura that exists in the display panel 110. For this operation, the ELA Mura compensator 145 may apply an ELA Mura for-compensation band-reject filter to the image data DAT input from the external component to generate ELA Mura compensated image data DAT' corresponding to the data signal DS. For example, the ELA Mura compensator 145 may provide the ELA Mura compensated image data DAT' to the data driver 130. Thus, the data driver 130 may convert the ELA Mura compensated image data DAT' (which may be a digital signal) to the data signal DS (which may be an analog signal). According to exemplary embodiments of the present inventive concept, the ELA Mura compensator 145 may be part of the timing controller 140 or the data driver 130. It is illustrated in FIG. 12 that the ELA Mura compensator 145 is implemented within the timing controller 140. According to exemplary embodiments of the present inventive concept, the ELA Mura compensator 145 may be external to the timing controller 140 and the data driver 130.

As described above, the ELA Mura compensator 145 may include the ELA Mura for-compensation band-reject filter for compensating for the ELA Mura that exists in the display panel 110. Here, the ELA Mura for-compensation band-reject filter may be installed in the ELA Mura compensator 145 when the display device 100 is manufactured. The ELA Mura for-compensation band-reject filter included in the ELA Mura compensator 145 may be determined by generating a high gray-scale luminance image and a low gray-scale luminance image. The high gray-scale luminance image and the low gray-scale luminance image that are displayed on the display panel 110 may then be photographed using luminance measuring equipment. An ELA Mura for-measurement image may be generated having moiré-removed luminance values is generated. The moiré-removed luminance values are generated by dividing luminance values of the low gray-scale luminance image by luminance values of the high gray-scale luminance image. The ELA Mura for-measurement image is obtained at predetermined rotation angles while rotating. One-dimensional average data are generated by sequentially listing average luminance values, each of which is calculated by averaging luminance values in a predetermined direction on the ELA Mura for-measurement image. The one-dimensional average data is transformed into frequency-domain data based on a Fast Fourier Transform algorithm. A direction, an intensity, and a frequency of the ELA Mura that exists in the display panel 110 is obtained from target frequency-domain data having a maximum peak value among the frequency-domain data. According to some exemplary embodiments of the present inventive concept, the ELA Mura for-compensation band-reject filter included in the ELA Mura compensator 145 may be corrected based on a re-measured ELA Mura that is generated by measuring an ELA Mura based on a for-correction image displayed on the display panel 110.

According to exemplary embodiments of the present inventive concept, the ELA Mura compensator 145 may determine whether to apply the ELA Mura for-compensation band-reject filter to the image data DAT according to luminance of the image data DAT to be displayed on the display panel 110. For example, as illustrated in FIGS. 13 and 14, the ELA Mura compensator 145 may receive the image data DAT to be displayed on the display panel 110 (S210) and may check whether the luminance of the image data DAT is higher than a predetermined reference luminance REFERENCE LUMINANCE (S220). Here, when the luminance of the image data DAT is higher than the predetermined reference luminance REFERENCE LUMINANCE, the ELA Mura compensator 145 might not compensate the image data DAT (indicated by "NON-COMPENSATION REGION") (S230). For example, when the luminance of the image data DAT is higher than the predetermined reference luminance REFERENCE LUMINANCE, the ELA Mura compensator 145 might not apply the ELA Mura for-compensation band-reject filter to the image data DAT. When the luminance of the image data DAT is lower than the predetermined reference luminance REFERENCE LUMINANCE, the ELA Mura compensator 145 may differentially compensate the image data DAT according to the luminance of the image data DAT (indicated by COMPENSATION REGION) (S240). For example, when the luminance of the image data DAT is lower than the predetermined reference luminance REFERENCE LUMINANCE, the ELA Mura compensator 145 may differentially determine a degree of band-reject filtering of the ELA Mura for-compensation band-reject filter according to the luminance of the image data DAT. As described above, the display device 100 including the ELA Mura compensator 145 may accurately compensate for the ELA. Mura that exists in the display panel 110, and thus may provide a high-quality image (e.g., an ELA Mura compensated image) to a viewer.

Figure 15:
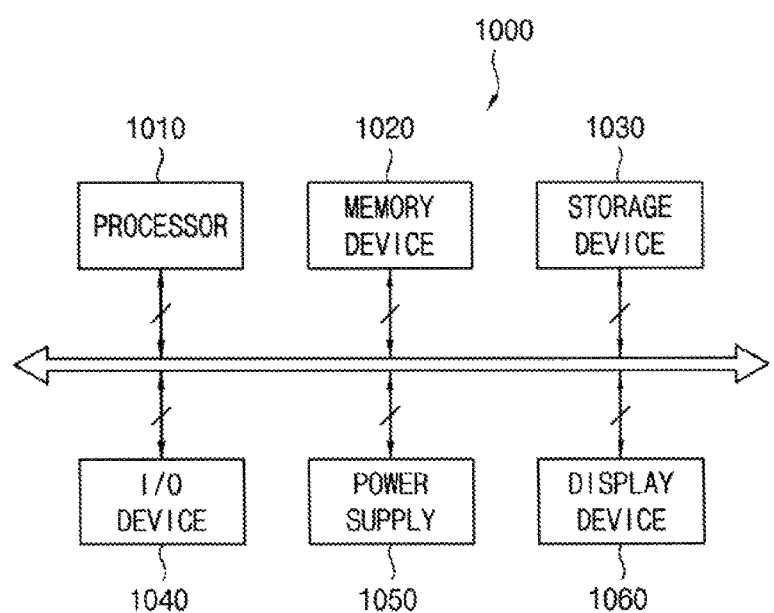
FIG. 15 is a block diagram illustrating an electronic device according to exemplary embodiments of the present inventive concept.
Figure 16:
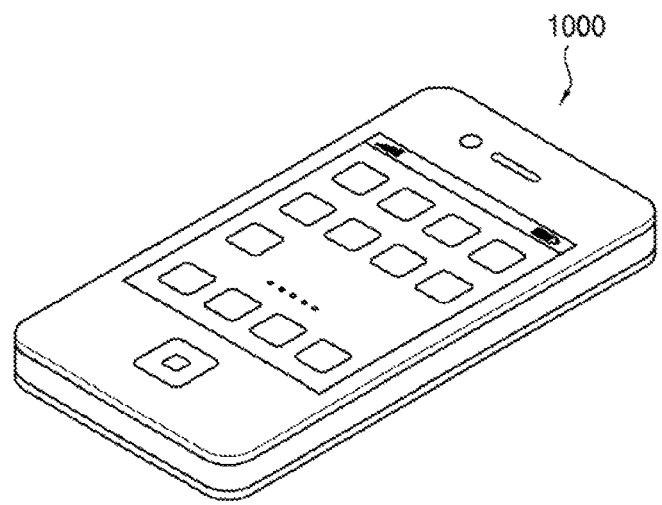
FIG. 16 is a diagram illustrating the electronic device of FIG. 15, implemented as a smart phone according to exemplary embodiments of the present inventive concept.
Figure 17:
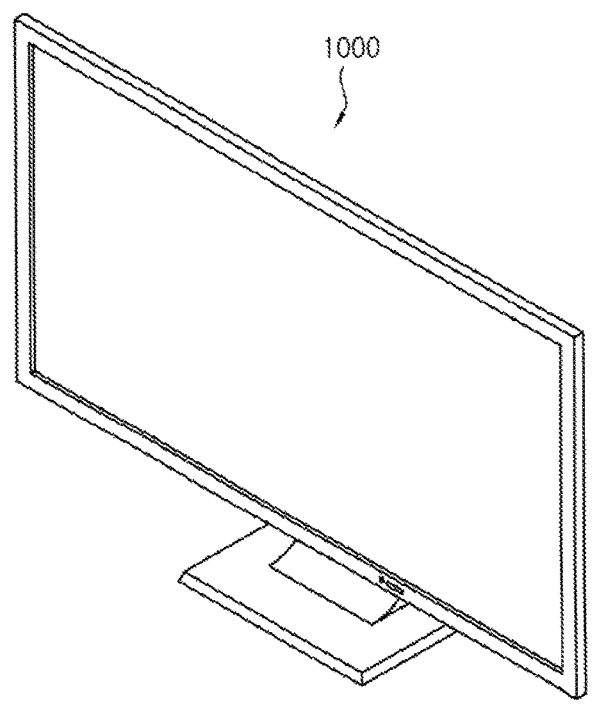
FIG. 17 is a diagram illustrating the electronic device of FIG. 15, implemented as a television according to exemplary embodiments of the present inventive concept.

FIG. 15 is a block diagram illustrating an electronic device according to exemplary embodiments of the present inventive concept. FIG. 16 is a diagram illustrating the electronic device of FIG. 15 implemented as a smart phone in accordance with exemplary embodiments of the present inventive concept. FIG. 17 is a diagram illustrating the electronic device of FIG. 15 implemented as a television in accordance with exemplary embodiments of the present inventive concept.

Referring to FIGS. 15 through 17, the electronic device 1000 may include a processor 1010, a memory device 1020 (e.g. RAM), a storage device 1030 (e.g. solid state or hard disk storage), an input/output (I/O) device 1040, a power supply 1050, and a display device 1060. Here, the display device 1060 may correspond to the display device 100 of FIG. 12. In addition, the electronic device 1000 may further include a plurality of ports for communicating with a video card, a sound card, a memory card, a universal serial bus (USB) device, other electronic devices, etc. According to an exemplary embodiment of the present inventive concept, as illustrated in FIG. 16, the electronic device 1000 may be implemented as a smart phone. According to an exemplary embodiment of the present inventive concept, as illustrated in FIG. 17, the electronic device 1000 may be implemented as a television. However, the electronic device 1000 is not limited to these exemplary implementations. For example, the electronic device 1000 may be implemented as a computer monitor, a head mounted display device, a laptop computer, a digital camera, a cellular phone, a video phone, a tablet computer, a smart watch, a tablet hybrid/convertible PC, an MP3 player, a car navigation system, etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus. The memory device 1020 may store data for operations of the electronic device 1000. For example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 1030 may include a solid state drive (SSD) device, a hard disk drive (HDD) device, a CD-ROM device, etc. The I/O device 1040 may include an input device such as a keyboard, a keypad, a mouse device, a touchpad, a touch-screen, etc and an output device such as a printer, a speaker, etc. According to exemplary embodiments of the present inventive concept, the display device 1060 may be included in the I/O device 1040. The power supply 1050 may provide power for operations of the electronic device 1000.

The display device 1060 may be coupled to other components via the buses or other communication links. According to an exemplary embodiment of the present inventive concept, the display device 1060 may be an organic light emitting display device or a liquid crystal display device. However, the display device 1060 is not limited thereto. As described above, the display device 1060 may accurately compensate for an ELA Mura that exists in a display panel, where the ELA Mura is caused in an excimer laser annealing (ELA) process when a display panel is manufactured. For this operation, the display device 1060 may include the display panel including a plurality of pixels, a scan driver that provides a scan signal to the display panel, a data driver that provides a data signal to the display panel, a timing controller that controls the scan driver and the data driver, and an ELA Mura compensator that generates ELA Mura compensated image data corresponding to the data signal by applying an ELA Mura for-compensation band-reject filter to image data. Here, the ELA Mura for-compensation band-reject filter included in the ELA Mura compensator may be determined by displaying a high-gray scale image and a low gray-scale image on a display panel. A high gray-scale luminance image and a low gray-scale luminance image is generated by photographing the display panel as it is displaying the aforementioned high gray-scale image and the low gray-scale image. The photographing may be performed using a luminance measuring device. An ELA Mura for-measurement image is generated having moiré-removed luminance values that are generated by dividing luminance values of the low gray-scale luminance image by luminance values of the high gray-scale luminance image. While rotating the ELA Mura for-measurement image, one-dimensional average data that are generated by sequentially listing average luminance values each of which is calculated by averaging luminance values in a predetermined direction on the ELA Mura for-measurement image, are obtained at predetermined rotation angles. The one-dimensional average data is transformed into frequency-domain data using a Fast Fourier Transform algorithm, and by obtaining a direction, an intensity, and a frequency of the ELA. Mura that exists in the display panel from target frequency-domain data having a maximum peak value among the frequency-domain data. According to exemplary embodiments of the present inventive concept, the ELA Mura for-compensation band-reject filter included in the ELA Mura compensator may be corrected based on a re-measured ELA Mura that is generated by measuring an ELA Mura based on a for-correction image displayed on the display panel.

Although a few example embodiments have been described, those skilled in the art will readily appreciate that many modifications are possible in the exemplary embodiments without materially departing from the novel teachings and aspects of the present disclosure.

What is claimed is:

1. A method of compensating for Mura in a display panel, the method comprising:
   displaying a high gray-scale image and a low gray-scale image on a display panel;
   photographing the high gray-scale image and the low gray-scale image using a luminance measuring equipment to generate a high gray-scale luminance image and a low gray-scale luminance image, respectively;
   generating an ELA Mura for-measurement image having moire-removed luminance values by dividing luminance values of the low gray-scale luminance image by luminance values of the high gray-scale luminance image;
   obtaining, at predetermined rotation angles while rotating the ELA Mura for-measurement image, one-dimensional average data by sequentially listing average luminance values, each of which is calculated by averaging luminance values in a predetermined direction on the ELA Mura for-measurement image;
   transforming the obtained one-dimensional average data into frequency-domain data using a Fast Fourier Transform algorithm;
   identifying target frequency-domain data having a maximum peak value from among the frequency-domain data;
   obtaining a direction, an intensity, and a frequency of the ELA Mura from the target frequency-domain data;
   determining an ELA Mura for-compensation band-reject filter based on the obtained direction, intensity, and frequency of the ELA Mura; and
   applying the ELA Mura for-compensation band-reject filter to initial image data to generate corrected image data.

2. The method of claim 1, wherein the moire-removed luminance values are normalized to be less than or equal to 1.

3. The method of claim 1, wherein the ELA Mura for-measurement image is rotated from 0° to 180°, an interval of the rotation angles is 0.1°, and a number of the one-dimensional average data is 1800.

4. The method of claim 1, wherein the direction of the ELA Mura is determined based on the rotation angle at which the target frequency-domain data is obtained, the intensity of the ELA Mura is determined based on the maximum peak value of the target frequency-domain data, and the frequency of the ELA Mura is determined based on a frequency at which the maximum peak value of the target frequency-domain data is located.

5. The method of claim 4, wherein the ELA Mura for-compensation band-reject filter has no band-reject frequency band when the maximum peak value of the target frequency-domain data is less than a predetermined reference value.

6. The method of claim 4, wherein a band-reject frequency band of the ELA Mura for-compensation band-reject filter includes the frequency at which the maximum peak value of the target frequency-domain data is located.

7. The method of claim 6, wherein a degree of band-reject filtering of the ELA Mura for-compensation band-reject filter decreases as luminance of the image data increases.

8. The method of claim 6, wherein the ELA Mura for-compensation band-reject filter performs no band-reject filtering when luminance of the image data is higher than predetermined reference luminance.

9. The method of claim 1, further comprising: correcting the ELA Mura for-compensation band-reject filter based on a re-measured ELA Mura that is generated by measuring the ELA Mura based on a for-correction image displayed on the display panel.

10. A display device comprising:
a display panel including a plurality of pixels;
a scan driver configured to provide a scan signal to the display panel;
a data driver configured to provide a data signal to the display panel;
a timing controller configured to control the scan driver and the data driver; and
an excimer laser annealing (ELA) Mura compensator configured to determine an ELA Mura for-compensation band-reject filter based on a direction, an intensity, and a frequency of an ELA Mura of the display panel and generate ELA Mura compensated image data corresponding to the data signal by applying the determined Mura for-compensation band-reject filter to image data.

11. The device of claim 10, wherein the ELA Mura compensator is included within the timing controller or the data driver.

12. The device of claim 10, wherein the ELA Mura compensator is external to the timing controller and the data driver.

13. A display device comprising:
a display panel including a plurality of pixels;
a scan driver configured to provide a scan signal to the display panel;
a data driver configured to provide a data signal to the display panel;
a timing controller configured to control the scan driver and the data driver; and
an excimer laser annealing (ELA) Mura compensator configured to generate ELA Mura compensated image data corresponding to the data signal by applying an Mura for-compensation band-reject filter to image data,
wherein the ELA Mura for-compensation band-reject filter is determined by:
displaying a high gray-scale image arid a low gray-scale image on a display panel;
photographing the high gray-scale image and the low gray-scale image using a luminance measuring equipment to generate a high gray-scale luminance image and a low gray-scale luminance image, respectively
generating an ELA Mura for-measurement image having moire-removed luminance values by dividing luminance values of the low gray-scale luminance image by luminance values of the high gray-scale luminance image;
obtaining, at predetermined rotation angles while rotating the ELA Mura for-measurement image, one-dimensional average data by sequentially listing average luminance values each of which is calculated by averaging luminance values in a predetermined direction on the ELA Mura for-measurement image;
transforming the obtained one-dimensional average data into frequency-domain data using a Fast Fourier Transform algorithm;
identifying target frequency-domain data having a maximum peak value from among the frequency-domain data; and
obtaining a direction, an intensity, and a frequency of an ELA Mura that exists in the display panel from the target frequency-domain data having a maximum peak value among the frequency-domain data.

14. The device of claim 13, wherein the moire-removed luminance values are normalized to be less than or equal to 1.

15. The device of claim 13, wherein the ELA Mura for-measurement image is rotated from 0° to 180°, an interval of the rotation angles is 0.1°, and a number of the one-dimensional average data is 1800.

16. The device of claim 13, wherein the direction of the ELA Mura is determined based on the rotation angle at which the target frequency-domain data is obtained, the intensity of the ELA Mura is determined based on the maximum peak value of the target frequency-domain data, and the frequency of the ELA Mura is determined based on a frequency at which the maximum peak value of the target frequency-domain data is located.

17. The device of claim 16, wherein a band-reject frequency band of the ELA Mura for-compensation band-reject filter includes the frequency at which the maximum peak value of the target frequency-domain data is located.

18. The device of claim 17, wherein a degree of band-reject filtering of the ELA Mura for-compensation band-reject filter decreases as luminance of the image data increases.

19. The device of claim 17, wherein the ELA Mura for-compensation band-reject filter performs no band-reject filtering when luminance of the image data is higher than predetermined reference luminance.

20. The device of claim 13, wherein the ELA Mura for-compensation band-reject filter is corrected based on a re-measured ELA Mura that is generated by measuring the ELA Mura based on a for-correction image displayed on the display panel.

* * * * *